(12) United States Patent
Roscoe et al.

(10) Patent No.: US 7,944,213 B2
(45) Date of Patent: May 17, 2011

(54) GROUND FAULT DETECTION DEVICE

(75) Inventors: George William Roscoe, West Hartford, CT (US); Thomas Frederick Papallo, Jr., Farmington, CT (US); Cecil Rivers, Jr., West Hartford, CT (US)

(73) Assignee: General Electric Company, Schenectady, NY (US)

( * ) Notice: Subject to any disclaimer, the term of this patent is extended or adjusted under 35 U.S.C. 154(b) by 56 days.

(21) Appl. No.: 12/565,862

(22) Filed: Sep. 24, 2009

(65) Prior Publication Data

US 2011/0068802 A1    Mar. 24, 2011

(51) Int. Cl.
G01R 31/14 (2006.01)
H02H 9/08 (2006.01)
(52) U.S. Cl. .............................. 324/509; 361/42; 361/50
(58) Field of Classification Search .................. 324/509; 361/42–50
See application file for complete search history.

(56) References Cited

U.S. PATENT DOCUMENTS

| 3,611,036 | A | | 10/1971 | Edson |
| 4,216,515 | A | | 8/1980 | Van Zeeland |
| 4,811,154 | A | * | 3/1989 | Trenkler et al. .............. 361/93.1 |
| 4,851,782 | A | * | 7/1989 | Jeerings et al. ............... 324/509 |
| 5,365,396 | A | * | 11/1994 | Roberts et al. ................... 361/80 |
| 6,141,196 | A | * | 10/2000 | Premerlani et al. ............. 361/78 |
| 6,459,269 | B1 | | 10/2002 | Jones |
| 6,498,709 | B2 | * | 12/2002 | Kurosawa et al. .............. 361/80 |
| 6,718,271 | B1 | | 4/2004 | Tobin |
| 7,180,300 | B2 | * | 2/2007 | Premerlani et al. ........... 324/509 |
| 7,292,420 | B2 | | 11/2007 | Jones |
| 7,301,739 | B2 | | 11/2007 | Hamer |

FOREIGN PATENT DOCUMENTS

GB            679789            9/1952

OTHER PUBLICATIONS http://www.electronics-manufacturers.com/info/electrical-components/ground-fault-circuit-interrupter-gfci.html.

* cited by examiner

Primary Examiner — Timothy J Dole
(74) Attorney, Agent, or Firm — Global Patent Operation; Stephen G. Midgley

(57) ABSTRACT

A device and method to determine the presence of a ground fault that distinguishes between the capacitive portion of the currents to ground, and the resistive portion of the currents to ground by ascertaining aspects of the voltage and residual current waveforms.

8 Claims, 7 Drawing Sheets

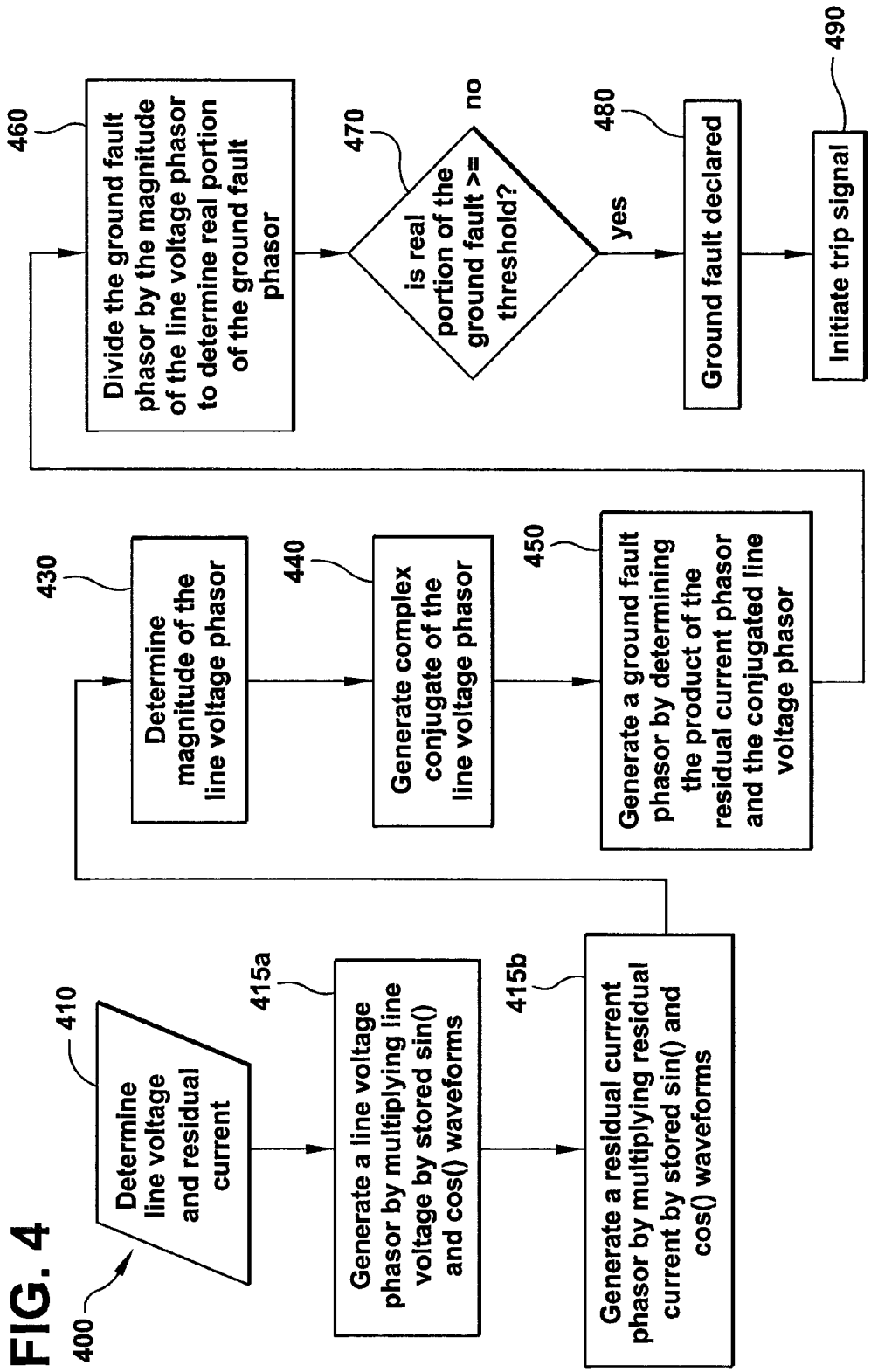

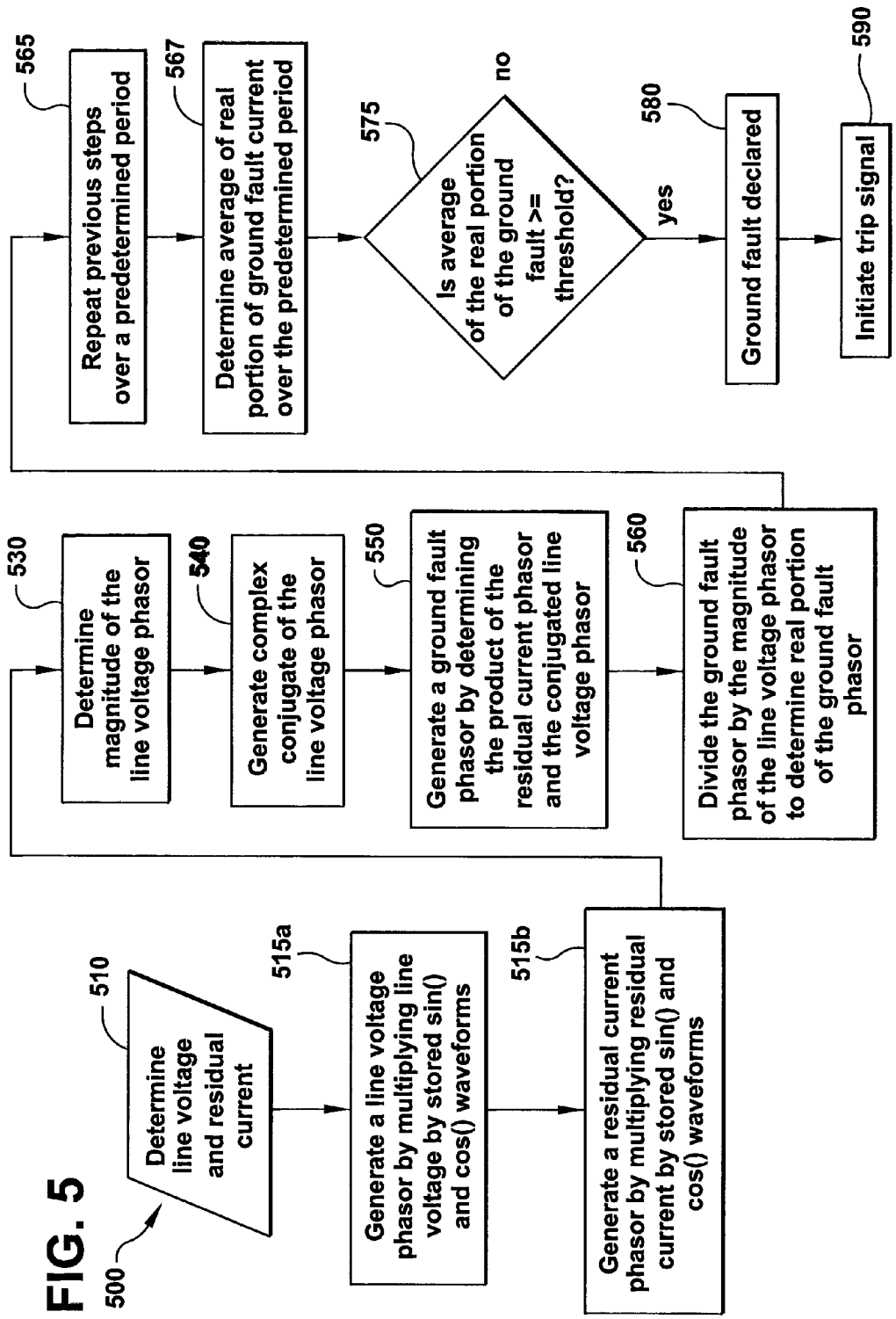

GROUND FAULT DETECTION DEVICE

BACKGROUND OF THE INVENTION

1. Field of the Invention

The field of the invention relates to electrical ground fault protection generally, and more particularly to certain new and useful advances in devices and methods for ground fault detection and interruption of which the following is a specification, reference being had to the drawings accompanying and forming a part of the same.

2. Description of Related Art

A ground fault is an undesirable condition in an electrical system, in which electrical current flows to the ground. A ground fault happens when the electrical current in a circuit leaks outside of its intended flow path. Ground fault circuit interrupters (GFCIs) or residual current devices (RCDs) are designed to protect such electrical hazards by interrupting a circuit when there is a ground fault, or residual current, such as a leakage of electrical current from an energized line conductor to ground. Conventional electric circuits normally carry balanced electrical currents, with the return current from an electrical load flowing through a neutral conductor. If no ground fault current is flowing, the phase and neutral currents of a branch circuit will sum to zero. In the event of a ground fault, the phase and neutral currents do not sum to zero and the difference between the phase and neutral currents is the ground fault current.

In some instances, the ground fault may result in lethal shocks or electrocution, such as in the case of a person who makes inadvertent contact with the phase conductor. The U.S. National Electrical Code (NEC) requires ground fault protection for both electric shock and equipment protection. A conventional GFCI is designed to detect predetermined levels (typically in the range of 4 to 6 milliamperes) of differential currents and to open the circuit, for example by tripping a circuit breaker, to remove the indicated shock hazard. If a differential current below the predetermined level is detected, current is normally allowed to flow uninterrupted. In some instances, ground fault protection devices alternatively provide a warning of a ground fault hazard but do not interrupt current flowing in the affected circuit, for example in fire protection applications where the ground current hazard is considered less dangerous than interrupting the current to fire prevention equipment.

FIG. 1 shows a conventional electrical circuit 10 such as a branch circuit having an AC power source 11 providing electrical power to a load 17. The load 17 is housed in an enclosure 18 which is connected to ground via a conductor 19. A conventional GFCI device 12 having switching contacts 13a, 13b is configured to measure the current balance between a line or phase conductor 15, connected between the source 11 and load 17, and a neutral return conductor 16, connected between the load 17 and source 11, using a differential current transformer 14. A current Ip flowing in phase conductor 15 and a return current Ir flowing in neutral conductor 16 are equal in magnitude (that is, the vector sum of Ip and Ir is zero) and no ground fault or residual current is flowing. The GFCI device 12 is configured to open contacts 13a, 13b to interrupt the current flow from source 11 to load 17 when it detects a difference in current between the phase and neutral conductors 15, 16.

FIG. 2 shows the circuit FIG. 1 but with a ground fault current $I_{gf}$ flowing in the grounded conductor 19 caused by a high impedance short-circuit 20 between the phase conductor 15 and the grounded enclosure 18. The value of the ground fault current $I_{gf}$ is a vector sum of the currents $I_p$, and $I_r$ flowing in the circuit 10 and can be expressed as a phasor, having both magnitude and phase.

It is well known that for conventional electrical systems, analysis of sinusoidal AC current and voltage performance is simplified by using a phasor characterization of the sinusoids. Such phasor characterization uses complex numbers, having "real" components associated with resistive elements, and "imaginary" components associated with reactive elements. Phasors are represented alternatively in polar or rectangular form on the complex plane. The rectangular representation of a phasor for an AC signal comprises both a real component and an imaginary component. The polar representation of a phasor for an AC signal comprises both a magnitude and an angle.

A conventional phasor diagram for the ground fault current Ig of FIG. 2 is shown in FIG. 3. In FIG. 3, the reactive, imaginary current component 33 flowing through the capacitance is shown at a right angle to the resistive, real current component 31. The imaginary current component 33 is purely reactive so it does not cause heating and does not present a shock hazard. Thus, the reactive current component 33 of the ground fault current does not necessitate tripping of the GFCI device 22 (FIG. 2). In contrast, the resistive component 31 does cause heating and does present a shock hazard. Thus, only the real component 31 of the current $I_{gf}$ necessitates the GFCI device 22 (FIG. 2) to trip at predetermined current levels; the imaginary component 33 does not.

It will be understood that in conventional electrical systems there is generally a capacitance between the circuit conductors and ground. A relatively high capacitance-to-ground is common on single and three-phase electrical distribution systems having voltages greater than 120 volts line-to-ground and results in a characteristic capacitive current. The relatively high capacitance-to-ground can be caused by various factors such as long conductors to a load, or by phase-to-ground capacitors connected in the circuit.

One problem that occurs with conventional GFCI devices in circuits with a high capacitance-to-ground is unnecessary or nuisance tripping caused by the capacitive current to ground in the absence of a real, or resistive, ground fault condition. That is, the capacitive, or reactive, currents can exceed the predetermined ground fault current threshold of conventional GFCI devices and result in a nuisance tripping of the GFCI in the protected circuits.

At voltages above 120 VAC, and at relatively low ground fault current trip settings in the milliamp range, the reactive portion 33 of the ground fault $I_{gf}$ is known to cause nuisance tripping of conventional ground fault devices 22 (FIG. 2). Such conventional devices have not been able to distinguish between the resistive (real) portion 31 of the ground fault and the reactive (imaginary) portion 33 of the ground fault current at the higher voltages.

Conventional methods of detect hazardous ground faults and distinguishing between real and imaginary parts of the ground fault current have determined a phase angle between the ground fault and phase currents, and measured a period of the ground fault alternating current and phase currents between respective zero crossings, and divided the respective time periods of the ground fault and phase currents. Additionally, the ground fault signal, and the measured period between respective zero crossings signal have been provided as one or more pulse signals to a controller.

One known shortcoming of such a conventional method, in the instance that the ground current is noisy or non-sinusoidal, the ground fault zero crossings may alter timing measurement of the conventional method, thus resulting in an incorrect zero crossing measurement. Moreover, since the controller must generate a pulse and measure pulses in order to determine the zero crossings and measure the time between zero crossings, the prior art methods can be complicated and subject to signaling errors.

For at least the reasons stated above, a need exists for an improved device and method to detect hazardous ground faults on single phase and multi-phase circuits at voltages over 120 VAC.

BRIEF SUMMARY OF THE INVENTION

One or more specific embodiments shown and/or described herein address at least the above-mentioned need.

Additionally, one or more embodiments shown and/or described herein provide a device and method to determine the presence of a ground fault that distinguishes between the capacitive portion of the currents to ground, and the resistive portion of the currents to ground by ascertaining aspects of a waveform rather than a segment thereof.

In one embodiment, the real portion of a reference phasor is considered to be the resistive portion of a ground fault current and compared to a predetermined threshold, the reference phasor being determined based on the real and imaginary portions of an AC voltage and an AC ground fault current.

An advantage over the conventional methods afforded by various embodiments of the present invention is that the detection of a ground fault current that requires interruption of current flow for personnel protection can, more simply and with less sensitivity to noise, be discerned from a ground fault current that does not require an interruption of current flow for personnel protection.

Apparatus and methods of varying scope are shown and described herein. In addition to the advantages described above, further advantages and/or adaptations or variations will become apparent by reference to the drawings and by reading the remaining portions of the specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings. The accompanying drawings, which are incorporated in and constitute a part of the specification, illustrate a presently preferred embodiment of the invention, in which:

FIG. 4 is a process flow of an embodiment of a method of the present invention;

FIG. 5 is a process flow of an alternative embodiment of a method of the present invention;

Like reference characters designate identical or corresponding components and units throughout the several views, which are not to scale unless otherwise indicated.

DETAILED DESCRIPTION OF THE INVENTION

Figure 1:
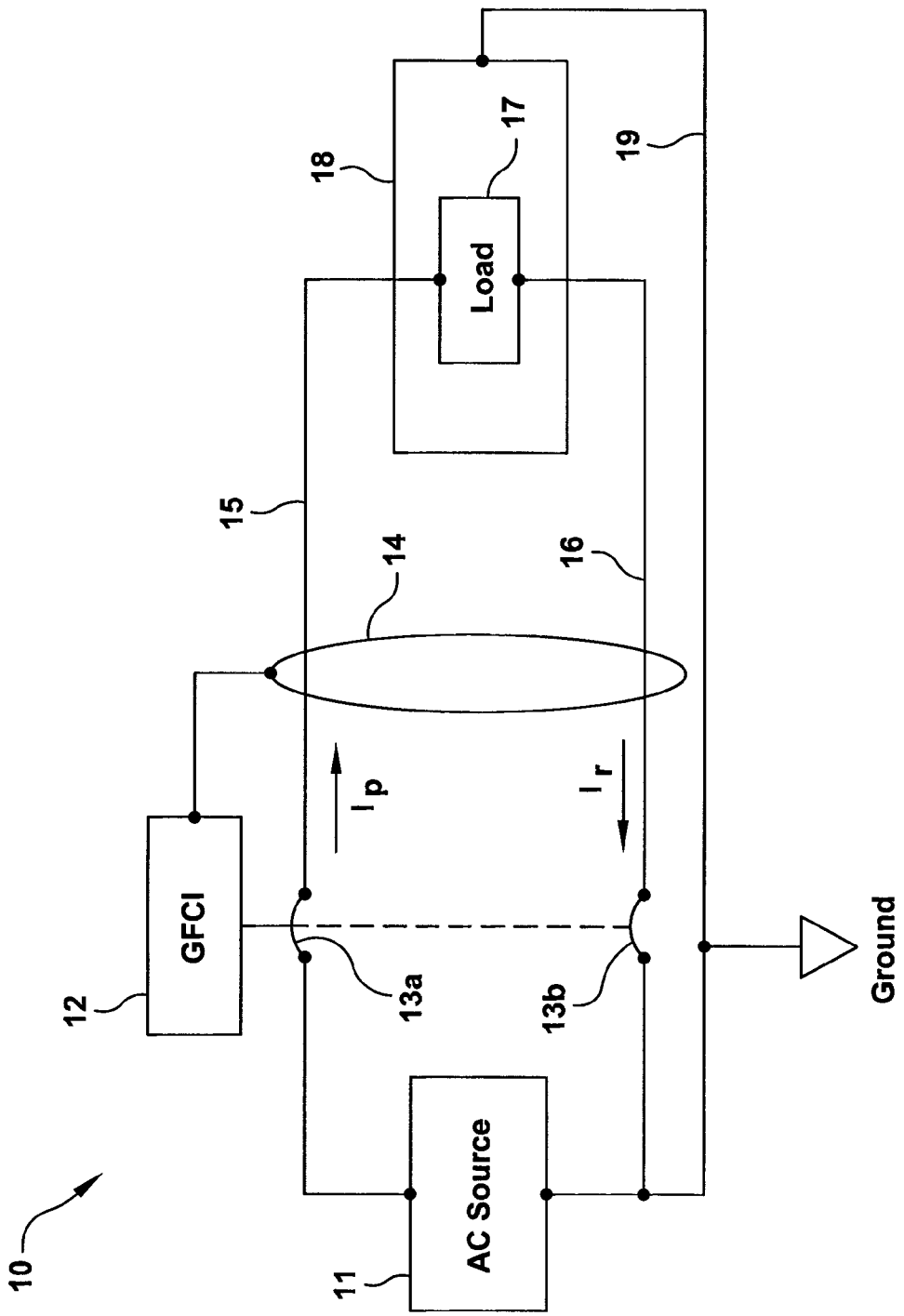
FIG. 1 is a schematic diagram of a conventional electric circuit having a conventional GFCI.

The following description makes reference to the accompanying drawings that form a part hereof, and in which is shown by way of illustration specific embodiments that may be practiced. It is understood that other embodiments may be utilized and that various changes can be made to the embodiments shown and described herein without departing from the patentable scope of the claims appended hereto. The following description is, therefore, not to be taken in a limiting sense.

As used herein, an element or function recited in the singular and proceeded with the word "a" or "an" should be understood as not excluding plural said elements or functions, unless such exclusion is explicitly recited. Furthermore, references to "one embodiment" of the claimed invention should not be interpreted as excluding the existence of additional embodiments that also incorporate the recited features.

The detailed description is divided into two sections. The first section describes method embodiments. The second section describes apparatus embodiments.

The present invention provides an improved method and device to discern an AC ground fault current having a resistive portion at a magnitude that requires interruption of the current flow by distinguishing between the resistive portion and the capacitive portion of the current to ground and both the real (resistive) and imaginary (reactive) portions of the voltage supplying the ground fault current.

For a given circuit having a ground fault current $I_{gf}$, the current $I_{gf}$ can be determined by the ratio of the real portion of the product of the residual current $I_r$ (i.e., the sum of the phase and neutral currents) and the complex conjugate of line or phase to neutral Voltage, V, to the Absolute value of phase to neutral Voltage, V, and may be represented in phasor format as:

$$I_{gf} = \frac{\operatorname{Re}\{(I_r) \times (V)^*\}}{|V|} \qquad \text{Eq. 01}$$

Additionally, graphical representations of Eq. 01 may alternatively be illustrated in a phasor diagram.

Method Embodiments

This section describes particular methods that can be performed by a computer, a processor, or a microprocessor. The methods are described by reference to a flowchart or a series of flowcharts.

In some embodiments, a method to determine the presence in a circuit of a real portion of a ground fault current above a predetermined threshold, and interrupting current flow, is implemented as a computer data signal embodied in a carrier wave, that represents a sequence of computer-executable instructions which, when executed by a processor cause the processor to perform the respective method, or any suitable combination of parts thereof. In other embodiments, a method to determine the presence in a circuit of a real portion of a ground fault current above a predetermined threshold, and interrupting current flow is implemented as a computer-accessible medium having computer-executable instructions configured to direct a computer, a processor, or a microprocessor to perform the respective method, or any suitable combination of parts thereof. In various embodiments, the computer-accessible medium is a magnetic medium, an electronic medium, or an optical medium.

Embodiments are described in terms of a computer, processor, or microprocessor executing the sequence of computer-executable instructions. However, some embodiments can be implemented entirely in computer hardware in which the computer-executable instructions are implemented in read-only memory. Some embodiments can also be implemented in client/server computing environments where remote devices that perform tasks are linked through a communications network. Program nodules can be located in both local and remote memory storage devices in distributed computing environments.

FIG. 4 is a flow chart illustrating exemplary steps in determining the presence in a circuit of a real portion of a ground fault current above a predetermined threshold, and providing a trip signal will be described herein with occasional reference to the phasor diagram of FIGS. 6a and 6b. In the illustrated embodiment, the method 400 begins at step 410 by measuring a line voltage and a residual current in the circuit.

At step 415a, a phasor representation 612 (FIG. 6a) of the line voltage having a real and an imaginary portion is then produced by multiplying the value of the line voltage measured in step 410 by a first and a second predetermined sinusoidal waveform. The first predetermined sinusoidal waveform is used to generate the real portion of the line voltage, and the second predetermined sinusoidal waveform is used to generate the imaginary portion of the line voltage. The first and the second predetermined sinusoidal waveforms are preferably each 90 degrees out of phase from each other, and are preferably selected to match the frequency of the voltage in the circuit. The first and second predetermined sinusoidal waveforms may be stored, for example in a memory of a microcontroller.

At step 415b, a phasor representation 617 (FIG. 6a) of the residual current, having a real and an imaginary portion, is produced by multiplying the value of the residual current determined in step 410 by a third and a fourth predetermined sinusoidal waveform. The third predetermined sinusoidal waveform is used to generate the real portion of the line current, and the fourth predetermined sinusoidal waveform is used to generate the imaginary portion of the line current. The third and the fourth predetermined sinusoidal waveforms are preferably each 90 degrees out of phase from each other, and are preferably selected to match the frequency of the current in the circuit. The third and the fourth predetermined sinusoidal waveforms may be stored, for example in a memory of a microcontroller.

At step 430, a magnitude of the line voltage phasor, is calculated.

Figure 6B:
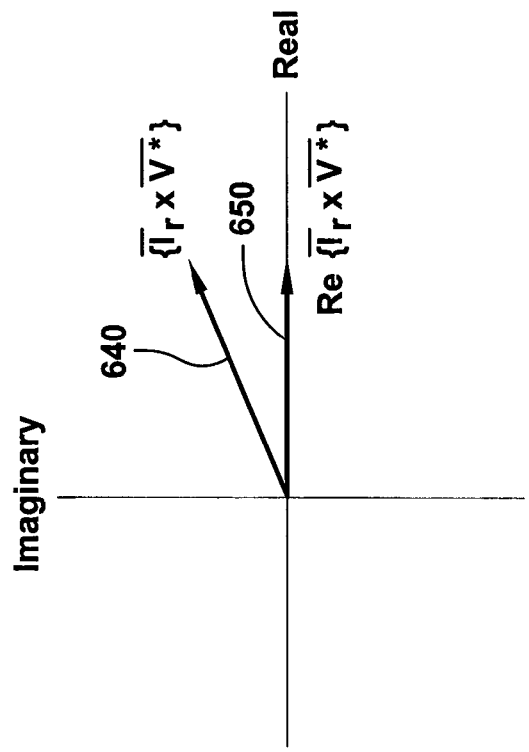
FIGS. 6*a*, and 6*b* are phasor diagrams illustrating elements of the embodiments of FIG. 4 and FIG. 5.
Figure 6A:
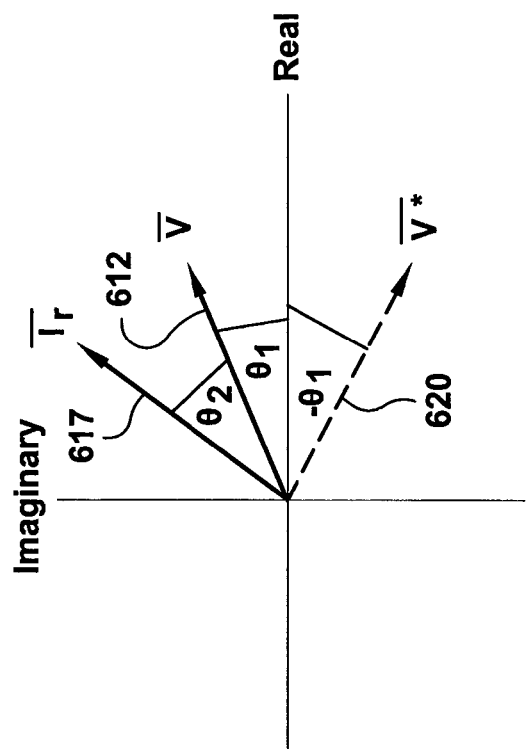

At step 440, a complex conjugate 620 (FIG. 6a) of the line voltage phasor 612 (FIG. 6a) is generated by determining a negative of the imaginary portion, or phase angle, of the line voltage phasor 612 (FIG. 6a).

At step 450, the residual current phasor 617 (FIG. 6a) is multiplied by the conjugated line voltage phasor 620 (FIG. 6a) generated at step 440 to generate a phasor representation of a ground fault current 640 (FIG. 6b).

At step 460, the ground fault current phasor 640 (FIG. 6b) generated at step 450 is divided by the magnitude of the line voltage phasor determined at step 430 to determine a real portion 650 (FIG. 6b) of the ground fault current.

At step 470, the real portion 650 (FIG. 6b) of the ground fault current determined at step 460 is compared to a threshold or predetermined level of ground fault current. If the real portion 650 (FIG. 6b) of the ground fault current is above the predetermined level of ground fault current, then at step 480, a true ground fault condition is determined to exist.

If a true ground fault condition is determined to exist, then at step 490, a trip signal is triggered. The trip signal initiates opening the circuit, for example by tripping a circuit breaker, to remove the ground fault condition. Alternatively, the trip signal may trigger a warning of the determined ground fault hazard, and may or may not additionally trigger tripping a circuit breaker, to remove the ground fault condition.

FIG. 5 is a flow chart illustrating alternative exemplary steps involved in computing the real portion of a ground fault. In the illustrated embodiment, the method 500 begins at step 510 by measuring a line voltage and a residual current in the circuit.

At step 515a, a phasor representation 612 (FIG. 6a) of the line voltage having a real and an imaginary portion is then produced by multiplying the value of the line voltage measured in step 510 by a first and a second predetermined sinusoidal waveform. The first predetermined sinusoidal waveform is used to generate the real portion of the line voltage, and the second predetermined sinusoidal waveform is used to generate the imaginary portion of the line voltage. The first and the second predetermined sinusoidal waveforms are preferably each 90 degrees out of phase from each other, and are preferably selected to match the frequency of the voltage in the circuit. The first and second predetermined sinusoidal waveforms may be stored, for example in a memory of a microcontroller.

At step 515b, a phasor representation 617 (FIG. 6a) of the residual current, having a real and an imaginary portion, is produced by multiplying the value of the residual current determined in step 510 by a third and a fourth predetermined sinusoidal waveform. The third predetermined sinusoidal waveform is used to generate the real portion of the line current, and the fourth predetermined sinusoidal waveform is used to generate the imaginary portion of the line current. The third and the fourth predetermined sinusoidal waveforms are preferably each 90 degrees out of phase from each other, and are preferably selected to match the frequency of the current in the circuit. The third and the fourth predetermined sinusoidal waveforms may be stored, for example in a memory of a microcontroller.

At step 530, a magnitude of the line voltage phasor, is calculated.

At step 540, a complex conjugate 620 (FIG. 6a) of the line voltage phasor 612 (FIG. 6a) is generated by determining a negative of the imaginary portion, or phase angle, of the line voltage phasor 612 (FIG. 6a).

At step 550, the residual current phasor 617(FIG. 6a) is multiplied by the conjugated line voltage phasor 620 (FIG. 6a) generated at step 540 to generate a phasor representation of a ground fault current 640 (FIG. 6b).

At step 560, the ground fault current phasor 640 (FIG. 6b) generated at step 550 is divided by the magnitude of the line voltage phasor determined at step 530 to determine a real portion 650 (FIG. 6b) of the ground fault current.

At step 565, the above steps 510-560 are repeatedly followed for a predetermined period, such as for example several electrical cycles, to generate corresponding resultant phasors. At step 567, the determined real portion of the ground fault current 650 (FIG. 6b) for each resultant phasor is averaged to determine an average real portion of the ground fault current. The average real portion of the ground fault current determined at step 567 is then compared to a threshold or predetermined level of ground fault current. If the real portion of the ground fault current is above the predetermined level of ground fault current, a true ground fault condition is determined to exist.

If a true ground fault condition is determined to exist, then at step 570, a trip signal is triggered. The trip signal initiates opening the circuit, for example by tripping a circuit breaker, to remove the ground fault condition. Alternatively, the trip signal may trigger a warning of the determined ground fault hazard, and may or may not additionally trigger tripping a circuit breaker, to remove the ground fault condition.

Apparatus Embodiments

The previous section described a method of how an embodiment of the invention operates. This section describes a particular apparatus of such an embodiment with reference to FIG. 7.

Figure 7:
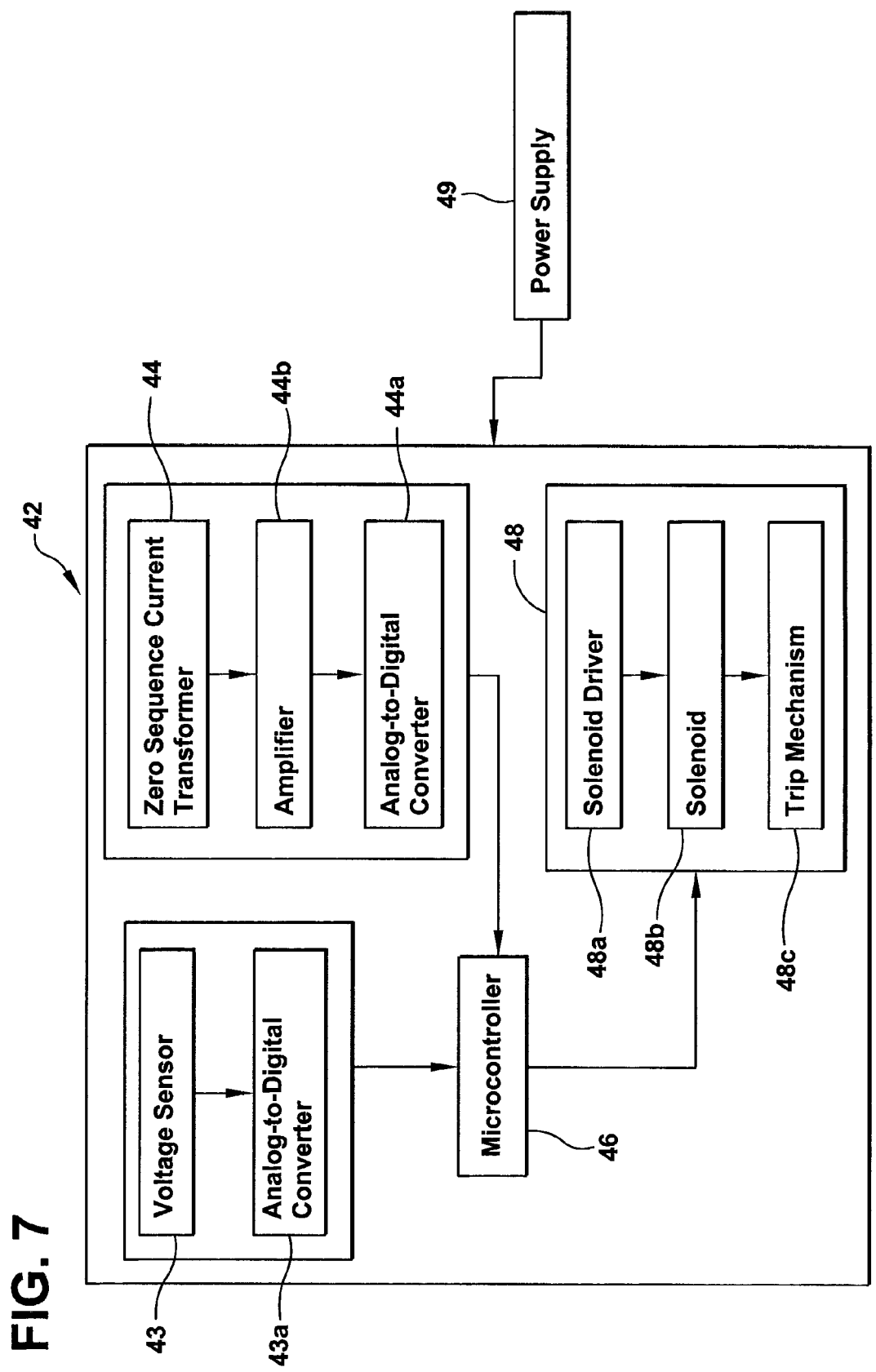
FIG. 7 is a functional diagram of an embodiment a device of the present invention.

One embodiment of a GFCI device 42 of the present invention for ground fault detection in a circuit is shown in functional block diagram representation in FIG. 7. A current sensor 44 provides an indication of residual current to an amplifier 44*b* and a first analog-to-digital (A-D) converter 44*a*. In one exemplary embodiment, the current sensor 44 is a zero-sequence type current transformer (CT) having a primary and a secondary coil, configured to have a line conductor 15 (FIG. 1) and a neutral conductor 16 (FIG. 1) of a conventional circuit pass through the primary coil. In one embodiment, the amplifier 44*b* comprises two cascaded non-inverting amplifiers. The first A-D converter 44*a* provides a digital indication of the sensed residual current to a Microcontroller 46 for processing. Microcontroller 46 performs computational, timing, memory, and display functions. A voltage sensor 43 detects a voltage between line conductor 15 (FIG. 1) and neutral conductor 16 (FIG. 1) of the protected circuit and provides an indication of the detected voltage to a second analog-to-digital (A-D) converter 43*a*. In one exemplary embodiment, the line voltage is detected across a burden resistor connected across the current transformer 44 secondary coil to ground. The second A-D converter 43*a* provides a digital indication of the sensed voltage to a microcontroller 46 for processing. In an alternative embodiment, the analog-to-digital conversion of the detected line voltage signal and residual current may alternatively be made by the microcontroller 46 instead of the A-D converters 43*a*, 44*a*. If the real portion of the ground fault current is above the predetermined level of ground fault current, a true ground fault condition is determined by to exist by microcontroller 46 and a trip signal is provided by microcontroller 46 to an interrupter 48 portion of GFCI 42. In one embodiment, interrupter 48 includes a solenoid driver circuit 48*a* in communication with a trip solenoid 48*b* for actuating the trip solenoid 48*b*. Trip solenoid 48*b*, when energized, actuates a trip mechanism 48*c* to trip or open the GFCI 42. GFCI 42 may be self-powered, for example using power from the protected circuit (not shown), or may use a stand-alone power source 49, such as for example, a battery.

This specification, including the claims, abstract and drawings, is intended to cover any adaptations or variations of the specific embodiments illustrated and described herein. Accordingly, the names of elements, components or features, of the above-described system, methods, and apparatus are not intended to be limiting. It is contemplated that the above-described embodiments, whether adapted or varied or not, are applicable to future GFCI apparatus and methods. Moreover, the terminology used herein is intended to encompass all GFCI apparatus and methods that provide the same or equivalent functionality described herein.

Although effort was made to show all of the particular elements, components or features of each of the above-described specific embodiments in separate figures, this may not have been possible. In the event that one or more elements, components or features of one or more of the above-described specific embodiments are shown in some drawings and not in others, it is contemplated that each element, component or feature of one drawing may be combined with any or all of the other elements, components or features shown in any or all of the remainder of the drawings, as described herein, as claimed herein or in any other suitable fashion.

The words "including", "comprising", "having", and "with" as used herein are to be interpreted broadly and comprehensively and are not limited to any physical interconnection. Additionally, patentable scope is defined by the following claims, which are intended to encompass not only the specific embodiments described above, but also adaptations or variations thereof (i) that have structural elements that do not differ from the literal language of the claims, or (ii) that have equivalent structural elements with insubstantial differences from the literal language of the claims.

What is claimed is:

1. A method to detect ground fault in an electrical circuit having a current flow at an AC voltage, comprising:
   a) determining a first phasor associated with said current flow;
   b) determining a second phasor associated with said voltage;
   c) calculating a complex conjugate of said second phasor;
   d) calculating a third reference phasor as a product of said first phasor and said complex conjugate of said second phasor;
   e) normalizing the real portion of said third phasor with respect to a magnitude of said second phasor;
   f) determining if said normalized real portion of said third phasor is above a predetermined threshold; and if so,
   g) producing a trip signal.

2. The method of claim 1 further comprising transforming said first phasor associated with said current flow and said second phasor associated with said voltage via a Discrete Fourier Transformation at the fundamental frequency of the voltage.

3. A method to detect ground fault in an electrical circuit having a current flow at an AC voltage, comprising:
   a) determining a first phasor associated with said current flow;
   b) determining a second phasor associated with said line voltage;
   c) calculating a complex conjugate of said second phasor;
   d) calculating a third phasor as a product of said first phasor and said complex conjugate of said second phasor;
   e) normalizing the real portion of said third phasor with respect to a magnitude of said second phasor;
   f) determining an average value of said normalized real portion of said third phasor over a predetermined period;
   g) comparing said average value of said normalized real portion of said third phasor to a predetermined threshold;
   h) determining if said average value of said normalized real portion of said third phasor is above said predetermined threshold; and if so,
   i) producing a trip signal.

4. The method of claim 3 further comprising transforming said first phasor associated with said current flow and said second phasor associated with said voltage via a Discrete Fourier Transformation at the fundamental frequency of the voltage.

5. A device for detecting a ground fault in an electrical circuit having an AC voltage and a current, comprising:
   a ground fault current interrupter configured to trip in response to the ground fault;
   a control circuit in signal communication with said ground fault detector;

said control circuit being programmed to:
- a) determine a first phasor associated with said current flow;
- b) determine a second phasor associated with said line voltage;
- c) calculate a complex conjugate of said second phasor
- d) calculate a third reference phasor as a product of said first phasor and said complex conjugate of said second phasor;
- e) normalize the real portion of said third phasor with respect to a magnitude of said second phasor;
- f) determine if said normalized real portion of said third phasor is above a predetermined threshold; and if so,
- g) provide a trip signal to said ground fault current interrupter.

6. The device of claim 5 wherein said control circuit is further programmed to transform said first phasor associated with said current flow and said second phasor associated with said line voltage via a Discrete Fourier Transformation at the fundamental frequency of the voltage signal.

7. A device for detecting a ground fault in an electrical circuit having an AC voltage and a current, comprising:
- a ground fault current interrupter configured to trip in response to the ground fault;
- a control circuit in signal communication with said ground fault detector;

said control circuit being programmed to:
- a) determine a first phasor associated with said current flow;
- b) determine a second phasor associated with said line voltage;
- c) calculate a complex conjugate of said second phasor;
- d) calculate a third phasor as a product of said first phasor and said complex conjugate of said second phasor;
- e) normalize the real portion of said third phasor with respect to a magnitude of said second phasor;
- f) determine an average value of said normalized real portion of said third phasor over a predetermined period;
- g) compare said average value of said normalized real portion of said third phasor to a predetermined threshold;
- h) determine if said average value of said normalized real portion of said third phasor is above said predetermined threshold; and if so,
- i) provide a trip signal to said ground fault current interrupter.

8. The device of claim 7 wherein said control circuit is further programmed to transform said first phasor associated with said current flow and said second phasor associated with said line voltage via a Discrete Fourier Transformation at the fundamental frequency of the voltage signal.

* * * * *

UNITED STATES PATENT AND TRADEMARK OFFICE
CERTIFICATE OF CORRECTION

Page 1 of 1

PATENT NO. : 7,944,213 B2
APPLICATION NO. : 12/565862
DATED : May 17, 2011
INVENTOR(S) : Roscoe et al.

Figure 2:
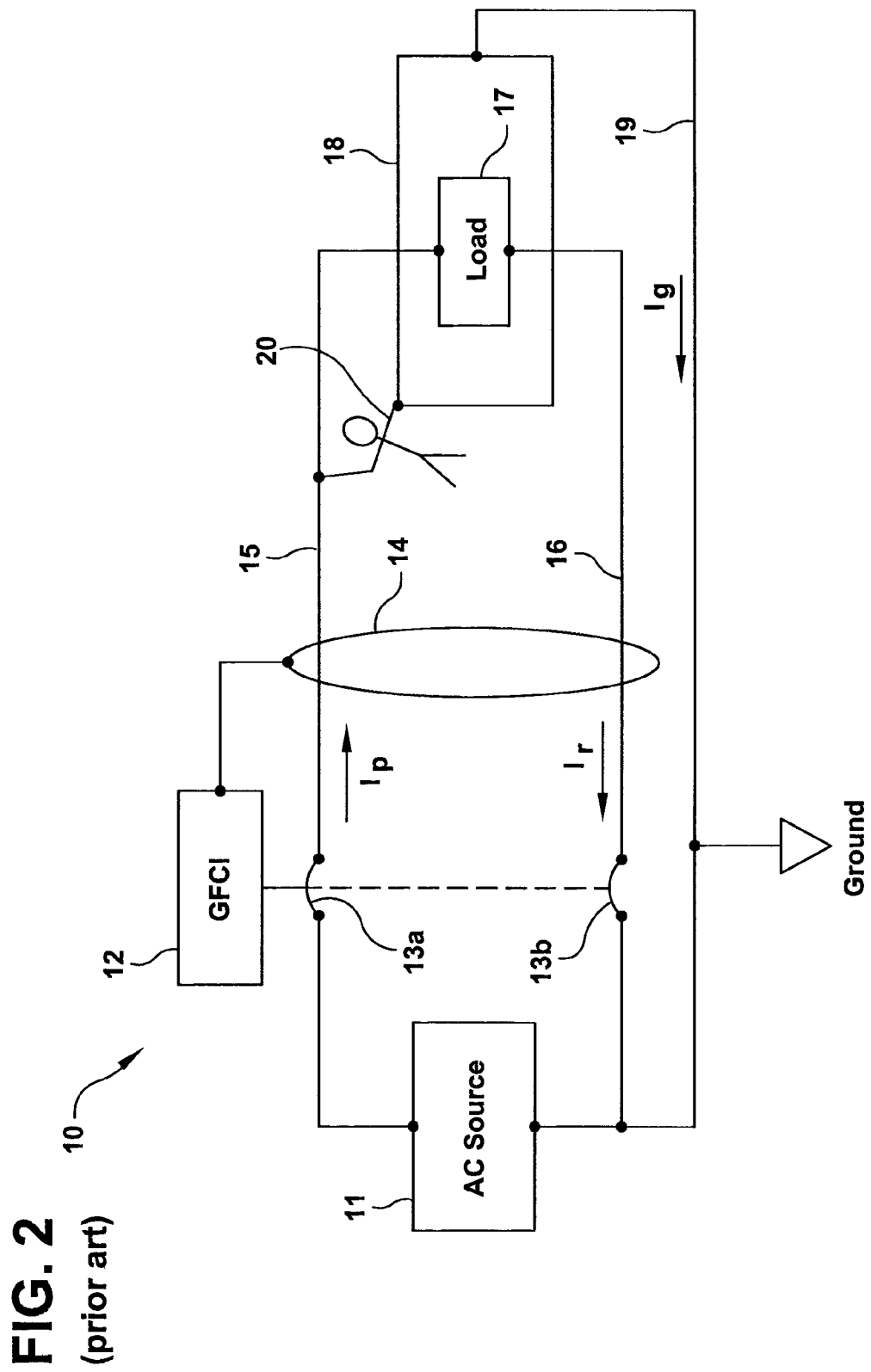
FIG. 2 is a schematic diagram of the conventional circuit of FIG. 1 wherein a ground fault condition exists.
Figure 3:
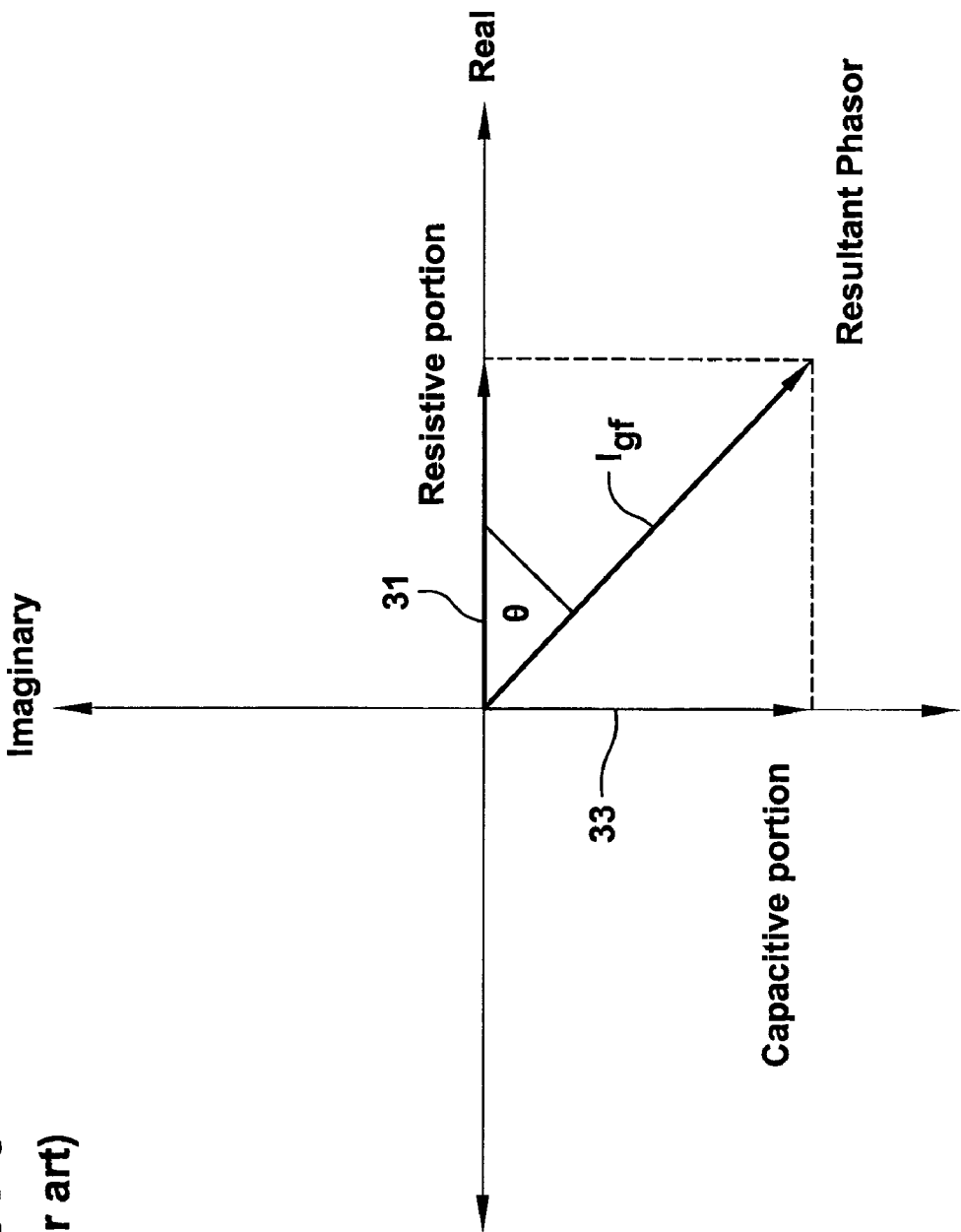
FIG. 3 is a conventional phasor diagram of a typical sinusoidal electrical waveform.

It is certified that error appears in the above-identified patent and that said Letters Patent is hereby corrected as shown below:

In Fig. 2, Sheet 2 of 7, delete "Ig" and insert -- $I_{gf}$ --, therefor.

In Column 2, line 16, delete "Ig" and insert -- $I_{gf}$ --, therefor.

In Column 9, Line 6, in Claim 5, delete "phasor" and insert -- phasor; --, therefor.

Signed and Sealed this
Eleventh Day of October, 2011

David J. Kappos
*Director of the United States Patent and Trademark Office*